(12) United States Patent
Koch

(10) Patent No.: US 6,674,266 B2
(45) Date of Patent: Jan. 6, 2004

(54) METHOD FOR DETERMINING THE OPERATING STATE OF AN ENERGY-STORAGE BATTERY

(75) Inventor: Ingo Koch, Hameln (DE)

(73) Assignee: VB Autobatterie GmbH, Hannover (DE)

(*) Notice: Subject to any disclaimer, the term of this patent is extended or adjusted under 35 U.S.C. 154(b) by 0 days.

(21) Appl. No.: 10/317,658

(22) Filed: Dec. 12, 2002

(65) Prior Publication Data
US 2003/0112010 A1 Jun. 19, 2003

(30) Foreign Application Priority Data
Dec. 14, 2001 (DE) .......................... 101 61 640

(51) Int. Cl.⁷ .................................. H02J 7/00
(52) U.S. Cl. ..................................... 320/132
(58) Field of Search ................. 320/132, 149, 320/150, 151, 152, 153; 324/427, 429, 430, 431, 433; 340/636; 702/63

(56) References Cited

U.S. PATENT DOCUMENTS

| | | | |
|---|---|---|---|
| 4,888,716 A | * 12/1989 | Ueno | 702/63 |
| 4,937,528 A | * 6/1990 | Palanisamy | 320/132 |
| 5,140,269 A | * 8/1992 | Champlin | 320/132 |
| 6,118,252 A | * 9/2000 | Richter | 320/132 |
| 6,163,133 A | * 12/2000 | Laig-Horstebrock et al. | 320/132 |

FOREIGN PATENT DOCUMENTS

| | | |
|---|---|---|
| DE | 37 12 629 C2 | 10/1992 |
| DE | 689 24 169 T2 | 3/1996 |
| DE | 197 50 309 A1 | 5/1999 |
| DE | 691 31 276 T2 | 12/1999 |
| DE | 198 47 648 A1 | 4/2000 |

* cited by examiner

Primary Examiner—Edward H. Tso
Assistant Examiner—Pia Tibbits
(74) Attorney, Agent, or Firm—Foley & Lardner

(57) ABSTRACT

A method for determining the operating state of an energy-storage battery in assumed temperature and state of charge conditions, which has the following steps: a) measurement of a temperature variable ($T_{ACT}$) which is correlated with the battery temperature ($T_{BAT}$), b) determination of the state of charge ($SOC_{ACT}$) of the energy-storage battery, c) determination of a further state variable ($A_{ACT}$) of the energy-storage battery, d) formation of a reference value ($B_V$) from the reference between the determined state variable ($A_{ACT}$) and a corresponding state variable ($A_{NEW}$) of an identical, new energy-storage battery with the same temperature variable ($T_{ACT}$) and the same state of charge ($SOC_{ACT}$), and e) determination of a predicted state variable ($A_P$) as a measure of the operating state for an assumed temperature variable ($T_P$) and an assumed state of charge ($SOC_P$) from known comparison reference values ($B_T$), which have been recorded as a function of temperature variables (T), states of charge (SOC) and the aging state of identical energy-storage batteries.

12 Claims, 2 Drawing Sheets

METHOD FOR DETERMINING THE OPERATING STATE OF AN ENERGY-STORAGE BATTERY

RELATED APPLICATION

This application claims priority of German Patent Application No. 101 61 640.6, filed Dec. 14, 2001.

FIELD OF THE INVENTION

This invention relates to a method for determining the operating state of an energy-storage battery in assumed temperature and state of charge conditions.

BACKGROUND

DE 37 12 629 C2 describes a measurement apparatus for the remaining life of a motor vehicle battery which detects battery voltage and associated load current value before and after initial starting with the battery in the fully charged state. It determines the temperature-compensated internal resistance and stores this in a memory, and compares it with internal resistance values determined during the subsequent processes of starting the internal combustion engine. The remaining life is then indicated as a function of predetermined, stored threshold values.

A vehicle battery operating state monitor is known from EP 0 438 477 B1 (De 689 24 169 T2). A vehicle battery is monitored to determine the battery capacity, state of charge and specific fault states. The ambient temperature, battery voltage, generator/regulator output voltage and currents in and out of the battery are measured continuously. Current/voltage data is analyzed to determine the internal resistance and polarization of the battery. Furthermore, an investigation is carried out with regard to the state of charge and fault states which result from corroded connecting terminals and a low electrolyte level. The cold start limit is determined by comparing the possible power output of the vehicle battery with the power required by the vehicle for the starting process. Data produced by the comparison is indicated on the vehicle dashboard.

An electronic tester fro assessing the capacity of a battery or cell is disclosed in EP 0 548 266 B1 (DE 691 31 276 T2). An independent electronic circuit provides an instantaneous assessment of the energy storage capacity of individual two-volt lead-acid cells or batteries which are composed of such cells. The tester is electrically connected to the connections of a cell or battery and measures the dynamic conductivity using a small signal that varies with time. An internal standard conductivity allows calibration of the tester to ensure the accuracy of the cell/battery measurements. Auxiliary terminals offer the capability for connection of a "reference conductivity", which is defined as the dynamic conductivity of an identically designed and produced cell or battery with 100% energy storage. The tester indicates either the conductivity of the tested cell/battery in Siemens (mhos) or its "percentage capacity" determined by normalization of the measured conductivity with respect to the "reference conductivity". When the "percentage capacity" is determined, a light-emitting diode illuminates when the result is below a preset limit value. When using individual cells, specific apparatus prevent high-current elements of the measurement circuit being fed directly by the two-volt cell under test by supplying these elements with low current, but with a higher voltage from a separate low-energy direct-current source, for example a small 9 volt transistor battery or a permanently installed DC/DC voltage converter, which is fed by the cell under test. This circuit design allows a transportable, independent electronic instrument, allowing the "percentage capacity" of a two-voltage cell or a battery which is composed of such cells to be assessed exactly on an instantaneous basis without any additional external power supply.

DE 197 50 309 A1 relates to a method for determining the starting capability of a starter battery of a motor vehicle in which the mean value of the voltage drop on starting the internal combustion engine is measured and compared with the voltage values of a family of characteristics, with the family of characteristics being based on measured voltage drops and associated battery and engine temperatures. In the method, the discrepancy between the instantaneously determined voltage drop and the voltage drop stored in the family of characteristics is determined, and an indication and alarm function is initiated as soon as the discrepancy exceeds a predetermined threshold value.

The conventional methods allow the actual state of an energy-storage battery to be evaluated and the internal resistance to be determined for the actual battery temperature and the actual state of charge. However, it is quite difficult to use this to predict the operating state under the influence of the operating age of the energy-storage battery for any desired further assumed temperature and state of charge conditions.

It would therefore be advantageous to provide a method for determining the operating state of an energy-storage battery in which the operating state can be predicted reliably for a desired further assumed temperature and state of charge conditions in assumed temperature and state of charge conditions by simple measurement of a temperature variable which is correlated with the battery temperature, determination of the state of charge and of a further state variable for the energy-storage battery.

SUMMARY OF THE INVENTION

This invention relates to a method for determining the operating state of an energy-storage battery in assumed temperature and state of charge conditions including measuring a temperature variable ($T_{ACT}$) which is correlated with a battery temperature ($T_{BAT}$), determining a state of charge ($SOC_{ACT}$) of the energy-storage battery, and determining a further state variable ($A_{ACT}$) of the energy-storage battery, forming a reference value ($B_V$) from a reference between the further state variable ($A_{ACT}$) and a corresponding state variable ($A_{NEW}$) of a substantially identical, new energy-storage battery with the same temperature variable ($T_{ACT}$) and the same state of charge ($SOC_{ACT}$), and determining a predicted state variable ($A_P$) as a measure of operating state for an assumed temperature variable ($T_P$) and an assumed state of charge ($SOC_P$) from known comparison reference values ($B_r$), which have been recorded as a function of temperature variables (T), states of charge (SOC) and the aging state of identical energy-storage batteries.

BRIEF DESCRIPTION OF THE DRAWINGS

The invention will be explained in more detail in the following text with reference to the attached drawings, in which.

DETAILED DESCRIPTION

Figure 1:
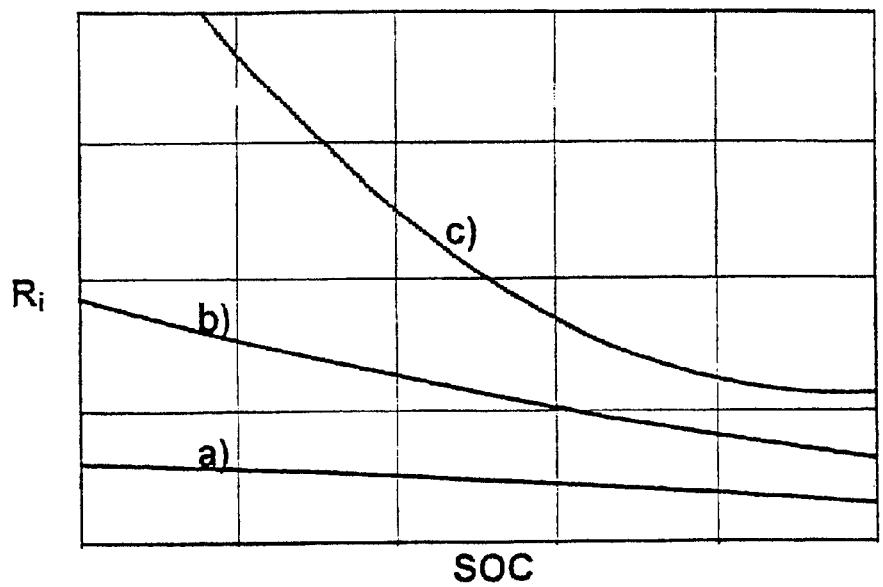
FIG. 1 is a graph of a typical relationship between the internal resistance of an energy-storage battery and the state of charge and an aging state.

The invention uses a method according to the following basic steps:

formation of a reference value from the reference between the determined state variable and a corresponding state variable of an identical, new energy-storage battery with the same temperature variable and the same state of charge, and determination of a predicted state variable as a measure of the operating state for an assumed temperature variable and an assumed state of charge from known comparison reference values, which have been recorded as a function of the temperature variable, the state of charge and the operating age of identical energy-storage batteries.

The aging state of the energy-storage battery is taken into account in the prediction by forming a reference value from the reference between the determined state variable and a corresponding state variable of an identical, new energy-storage battery for a fixed reference point, which is defined by the temperature variable and the state of charge. This assumes that the relationship between the state variable $A_{NEW}$ for a new energy-storage battery and the temperature variable and state of charge is known.

It is preferred that comparison reference values be recorded as a function of the temperature variable, the state of charge and the operating age of identical starting batteries. Finally, the reference value which is formed and the comparison reference values which are recorded can be used as a measure for determining the operating state of a predicted state variable for any desired assumed temperature variables and states of charge. This is done by evaluating the functional relationship between the comparison reference value and the temperature and state of charge conditions, as well as the aging influences.

The comparison reference values may be recorded as a value matrix. By comparison of the reference value which is formed with the comparison reference values in the value matrix in the area of the value matrix which is applicable to the determined state of charge and the measured temperature variable, it is then possible to uniquely deduce the aging level, which is correlated with a matching comparison reference value. If this aging level is known, comparison reference values for desired assumed temperature variables and states of charge can be taken from the value matrix and, if the state variable of an identical, new energy-storage battery is known, a predicted state variable can be determined for assumed temperature and state of charge conditions. It is likewise possible to predict future operating states in the same way, assuming a greater operating age.

Alternatively, the comparison reference values may also be recorded functionally. The aging state or the operating age of the starter battery with the associated comparison reference values can then be calculated mathematically from the reference value as a function of the temperature variable, of the state of charge and of the aging level, for example, by transformation. If the operating age is known, the function for calculating the comparison reference values for desired assumed temperature variables and states of charge is then also known, so that a state variable based on this can easily be determined as a measure of the operating state.

The reference value is preferably calculated from the ratio, that is to say, the quotient between the determined state variable and the corresponding state variable of an identical new energy-storage battery. As an alternative, however, the reference value may also be determined from the difference between the determined state variable and the corresponding state variable for an identical new energy-storage battery.

The operating state of an energy-storage battery can preferably be determined by measurement and evaluation of the internal resistance of the energy-storage battery as a state variable.

It is particularly advantageous to measure the voltage minimum of the terminal voltage of the energy-storage battery in response to a short-term load as the state variable. This voltage minimum may be used as a measure of the internal resistance since the voltage drop is proportional to the internal resistance of the energy-storage battery, and the voltage minimum is approximately inversely proportional to the internal resistance of the energy-storage battery. The voltage minimum for motor vehicle starter batteries can be determined easily during starting of the internal combustion engine.

The comparison reference values can be obtained empirically from operating experience with identical elderly energy-storage batteries, or can be calculated from a mathematical battery model of the energy-storage batteries.

It is particularly advantageous to predict not only the state variable as a measure of the operating state but, at the same time, to determine the aging state of the energy-storage battery from the reference values and the comparison reference values for a defined temperature variable and a defined state of charge.

Particularly for functionally recorded comparison reference values, it is advantageous to determine the reference value by means of transformation of the functional relationship between the comparison reference values and the state variable determined for the measured temperature variable and the determined state of charge on the basis of the assumed temperature variable and the assumed state of charge. The predicted state variable is then calculated from the reference value. This is done by forming a reference between the reference value and the state variable of an identical new energy-storage battery, for example, by forming the quotient or the difference.

Turning now to the drawings, FIG. 1 shows a diagram with different profiles of the internal resistance $R_1$ of energy-storage batteries which have been aged to different extents as a function of the state of charge SOC of the energy-storage batteries. The temperature variable T, which is correlated with the battery temperature $T_{BAT}$, is in this case constant. The internal resistance $R_1$ of a new energy-storage battery is approximately linear, and has the lowest resistance value in the fully charged state. As the state of charge SOC decreases, the internal resistance $R_1$ rises only slightly.

In the case of a slightly aged energy-storage battery, a slightly more than proportional rise in the internal resistance $R_1$ with a falling state of charge SOC can be seen, as shown in curve b).

Curve c) shows that a comparatively very high internal resistance $R_1$ can be observed with a very elderly energy-storage battery in the fully charged state, which rises sharply more than proportionally as the state of charge SOC falls.

Figure 2:
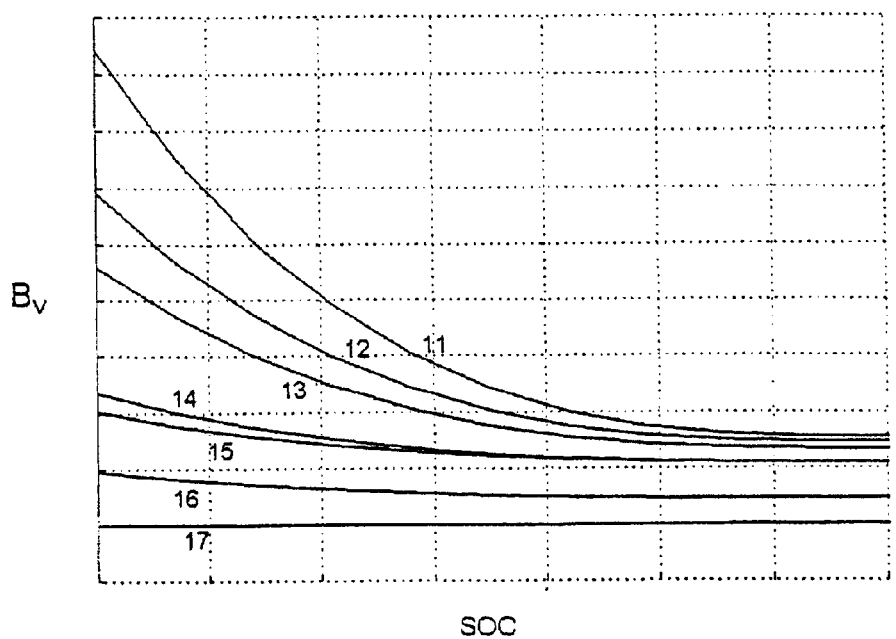
FIG. 2 is a graph of comparison reference values as a function of the state of charge for different aging states.

FIG. 2 shows a diagram with reference values $B_V$, which is formed from the reference between a determined state variable $A_{ACT}$ and a corresponding state variable $A_{NEW}$ for an identical new energy-storage battery. In this case, by way of example, the internal resistance $R_1$ of the energy-storage battery is once again evaluated as the state variable. The reference values $B_V$ are plotted against the state of charge SOC for a constant temperature variable $T_{ACT}$, for example, the battery temperature $T_{BAT}$ itself.

In this case, the energy-storage battery relating to the curve 11 is the most elderly. The aging level of the energy-storage batteries decreases further with the curves 12 to 16. The energy-storage battery associated with the curve 17 is new.

In the illustrated exemplary embodiment, the reference value $B_V$ is determined from the quotient of the determined internal resistance $R_1$ of the energy-storage battery and the internal resistance $R_1$ of the energy-storage battery in the new state, with the same temperature variable $T_{ACT}$ and the same state of charge $SOC_{ACT}$. The curve profile 17 which is associated with the new energy-storage battery is thus a straight line with the value 1, running parallel to the abscissa.

As the age of the energy-storage battery increases, the reference value $B_V$ for the fully charged energy-storage batteries rises further to a value of more than 2.5 times that of a new energy-storage battery. A resistance component is also added to this, which becomes ever greater as the state of charge SOC falls and the aging level increases.

Figure 3:
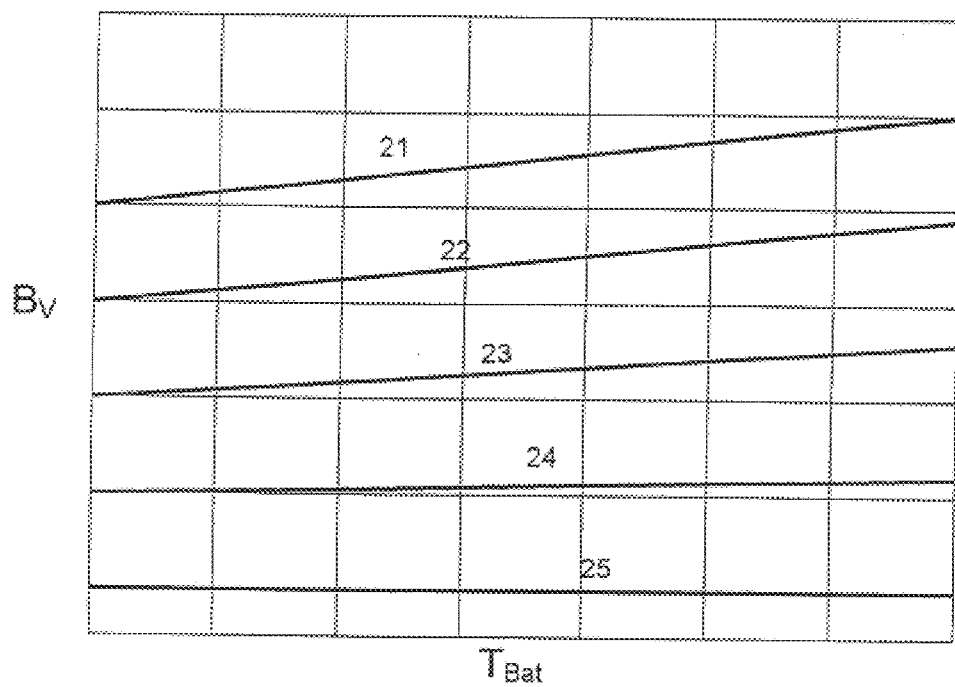
FIG. 3 is a graph of comparison reference values as a function of the battery temperature for a predetermined state of charge for different aging states.

FIG. 3 shows a diagram with reference values $B_V$ for energy-storage batteries of different age, as a function of a temperature variable $T_{ACT}$ which is correlated with the battery temperature $T_{BAT}$, preferably the battery temperature $T_{BAT}$ itself. The state of charge SOC is in this case constant.

The energy-storage battery associated with the curve 21 is in this case the most elderly in the illustrated exemplary embodiment. The aging level of the energy-storage batteries to which the curves 22 to 24 relate decreases. The curve 25 relates to an energy-storage battery in the new state. In this case as well, the reference value $B_V$ of the new energy-storage battery is once again a straight line with the value 1, running parallel to the abscissa.

As the age of the energy-storage battery increases, the internal resistance $R_1$ increases ever more sharply. In addition, the reference value $B_V$ of elderly energy-storage batteries rises still further with increasing battery temperature $T_{BAT}$, or with the temperature variable $T_{ACT}$ which is correlated with the battery temperature $T_{BAT}$. Thus, in addition to the state of charge SOC, it is also necessary to take account of a temperature variable $T_{ACT}$, which is correlated with the battery temperature $T_{BAT}$, when assessing the performance and the operating state of an energy-storage battery.

The illustrated relationships between the state variable A and the corresponding variables $B_V$ of identical energy-storage batteries can be determined empirically and recorded in a value matrix as comparison reference values as a function of the temperature variable T, the state of charge SOC and the aging level. The relationships with functions are preferably recorded, and the coefficients of the functions are preferably stored as a function of the aging level in a coefficient value matrix.

Figure 4:
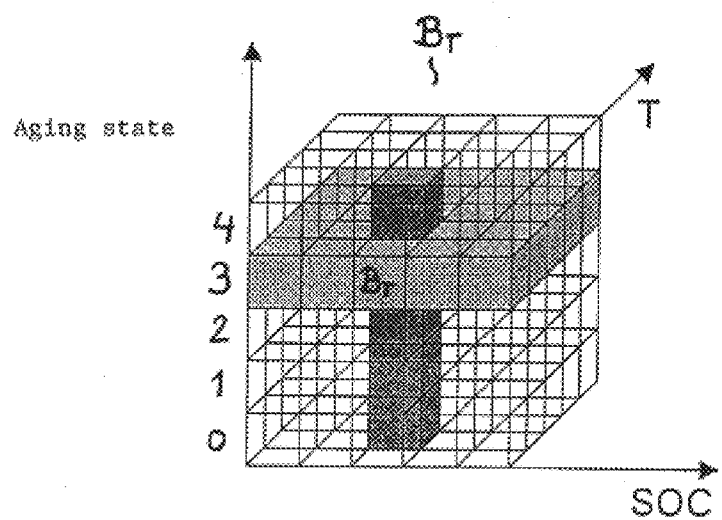
FIG. 4 is a graph of a value matrix with comparison reference values as a function of the state of charge, a temperature variable and the aging state.

FIG. 4 shows a graph of a value matrix in which comparison reference values $B_T$ are stored as a function of the state of charge SOC, the aging level, and the temperature variable $T_{ACT}$, which is correlated with the battery temperature $T_{BAT}$. The comparison reference values $B_T$ are determined from the state variable A of an energy-storage battery, which has been aged by the respective aging level, with respect to the state variable $A_{NEW}$ of an identical new energy-storage battery, on the basis of the respective temperature variable T and state of charge SOC. The comparison reference value BT thus have the value 1 for the aging level 0.

To determine the operating state, the temperature variable $T_{ACT}$ and the state of charge $SOC_{ACT}$ are measured first. A further state variable $A_{ACT}$, such as the internal resistance $R_1$ of the energy-storage battery, is determined in the prevailing ambient conditions. The measured temperature variable T and the state of charge SOC thus make it possible to delineate an area of comparison reference values $B_T$ in the value matrix, which is shown in FIG. 4 by the column that is shown as being dark gray, and from which it is possible to determine the aging level by comparison of the comparison reference values $B_T$ of the area with the reference value $B_V$ calculated from the determined state variable $A_{ACT}$.

If, by way of example, the aging level 3 has been determined, the plane of the value matrix for the comparison reference values $B_T$ is known in which all the predicted reference values $B_V$ are recorded for all the other possible temperature and state of charge conditions. The comparison reference value $B_T$ which is read from the value matrix for other temperature variables T and states of charge SOC is then once again referred to a corresponding state variable $A_{NEW}$ of an identical new energy-storage battery with the same assumed temperature variable T and the same assumed state of charge SOC, and this is used to determine the predicted state variable $A_P$ as a measure of the operating state in the assumed temperature and state of charge conditions.

It is likewise possible to predict future operating states by evaluating the planes of the value matrix for correspondingly higher aging levels.

As already explained above, instead of the comparison reference values $B_T$, the value matrix may contain only coefficients for functions for calculating the comparison reference values $B_T$. The evaluation method which is in the form of a model in FIG. 4 is not, however, fundamentally changed by this.

The value matrix with the comparison reference values $B_T$ can be expressed functionally using the following equation:

$$\frac{A_{ACT}}{A_{NEW}} = B_V = B_V(SOC, T, (B_V)_B),$$

where $A_{ACT}$ is a state variable for the energy-storage battery in the present state, for example, the internal resistance of the elderly battery, $A_{NEW}$ is the state variable for the identical new energy-storage battery, $B_V$ is the ratio of the two state variables $A_{ACT}$ and $A_{NEW}$, and $(B_V)_B$ is the ratio of the state variables $A_{ACT}$ to $A_{NEW}$ in defined conditions with the state of charge $SOC_B$ and the temperature variable $T_B$.

The value $(B_V)_B$ which is related to a fixed reference point $(SOC_B$ and $T_B)$ is a measure of the aging of the energy-storage battery.

If the state variable $A_{ACT}$ is determined for an existing state of charge $SOC_{ACT}$ and an existing temperature variable $T_{ACT}$, and the corresponding state variable $A_{NEW}$ of an identical new energy-storage battery in the same conditions relating to the state of charge $SOC_{ACT}$ and the temperature variable $T_{ACT}$ is known, it is possible to form the quotient of the determined state variable $A_{ACT}$ and the state variable $A_{NEW}$ of the identical new energy-storage battery, and determine the reference value $B_V$. The measure for the aging level can now be determined from the above function by transformation:

$$B_V = F(SOC, T, (B_V)_B) => (B_V)_B = f^{TRANS}(SOC_{ACT}, T_{ACT}, B_V).$$

With the known aging level, the associated function $$(B_V)_B = (B_V)_B(SOC, T, B_V)$$

can be used to determine a comparison reference value $B_T$ for desired states of charge $SOC_P$ and $T_P$ and, by multiplication by the known value for the state variable $A_{NEW}$ of an identical new energy-storage battery with the same assumed temperature variables T and the same assumed state of charge SOC, to predict a corresponding state variable $A_P$, for example, a predicted internal resistance $R_P$. If the load on the energy-storage battery is known, it is possible to use the internal resistance $R_P$ determined to calculate the magnitude of the voltage drop in the assumed environmental conditions. This indication can be used, for example, to determine whether the energy-storage battery will be able to start an energy-storage battery will be able to start an internal combustion engine in the assumed temperature and state of charge conditions.

What is claimed is:

1. A method for determining the operating state of an energy-storage battery in assumed temperature and state of charge conditions comprising:
    a) measuring a temperature variable ($T_{ACT}$) which is correlated with a battery temperature ($T_{BAT}$);
    b) determining a state of charge ($SOC_{ACT}$) of the energy-storage battery;
    c) determining a further state of variable ($A_{ACT}$) of the energy-storage battery;
    d) forming a reference value ($B_V$) from a reference between the further state variable ($A_{ACT}$) and a corresponding state variable ($A_{NEW}$) of a substantially identical, new energy-storage battery with the same temperature variable ($T_{ACT}$) and the same state of charge ($SOC_{ACT}$); and
    e) determining a predicted state variable ($A_P$) as a measure of operating state for an assumed temperature variable ($T_P$) and an assumed state of charge ($SOC_P$) from known comparison reference values ($B_T$), which have been recorded as a function of temperature variables (T), states of charge (SOC) and the aging state of identical energy-storage batteries.

2. The method of claim 1, wherein the comparison reference values ($B_T$) are recorded as a value matrix.

3. The method of claim 1, wherein the comparison reference values ($B_T$) are recorded functionally.

4. The method of claim 3, wherein coefficients of the functions for the comparison reference values ($B_T$) are stored in a coefficient value matrix as a function of the aging state.

5. The method of claim 1, wherein the reference value ($B_V$) is calculated from a ratio between the determined state variable ($A_{ACT}$) and the corresponding state variable ($A_{NEW}$) of a substantially identical new energy-storage battery.

6. The method of claim 1, wherein the reference value ($B_V$) is calculated from the differences between the determined state variable ($A_{ACT}$) and the corresponding state variable ($A_{NEW}$) of a substantially identical new energy-storage battery.

7. The method of claim 1, wherein state variable (A) is the internal resistance ($R_1$) of the energy-storage battery.

8. The method of claim 7, wherein the state variable (A) is a voltage minimum of a terminal voltage of the energy-storage battery for a known load.

9. The method of claim 1, wherein the comparison reference values ($B_T$) are obtained empirically from operating experience with substantially identical elderly energy-storage batteries.

10. The method of claim 1, wherein the comparison reference values ($B_T$) are calculated from a mathematical battery model of the energy-storage batteries.

11. The method of claim 1, further comprising:
    determining an aging state of the storage battery from reference values ($B_V$) and from comparison reference values ($B_T$) for a defined temperature variable (T) and a defined state of charge (SOC).

12. The method of claim 1, further comprising:
    determining a reference value ($B_V$) by the assumed temperature variable ($T_P$) and the assumed state of charge ($SOC_P$) by transformation of a functional relationship between the comparison reference values ($B_T$) and the state variable ($A_{ACT}$) determined for the measured temperature variable ($T_{ACT}$) and the determined state of charge ($SOC_{ACT}$), and calculating a predicted state variable ($A_P$) from the reference between the reference value ($B_V$) and the state variable ($A_{NEW}$) of a substantially identical new storage battery.

* * * * *